(12) United States Patent
Lin et al.

(10) Patent No.: US 10,049,083 B2
(45) Date of Patent: Aug. 14, 2018

(54) MEASUREMENT MATRIX GENERATING SYSTEM BASED ON SCRAMBLING AND METHOD THEREOF

(71) Applicants: MediaTek Inc., Hsinchu (TW); NATIONAL TAIWAN UNIVERSITY, Taipei (TW)

(72) Inventors: Yu-Min Lin, Taipei (TW); Jing Geng, Taipei (TW); Jie-Fang Zhang, Taipei (TW); An-Yeu Wu, Taipei (TW)

(73) Assignees: MediaTek Inc., Hsinchu (TW); National Taiwan University, Taipei (TW)

( * ) Notice: Subject to any disclaimer, the term of this patent is extended or adjusted under 35 U.S.C. 154(b) by 11 days.

(21) Appl. No.: 15/373,464

(22) Filed: Dec. 9, 2016

(65) Prior Publication Data

US 2017/0270074 A1  Sep. 21, 2017

Related U.S. Application Data

(60) Provisional application No. 62/308,231, filed on Mar. 15, 2016.

(51) Int. Cl.
*G06F 7/38* (2006.01)
*G06F 17/16* (2006.01)
*G11C 8/04* (2006.01)

(52) U.S. Cl.
CPC .............. *G06F 17/16* (2013.01); *G11C 8/04* (2013.01)

(58) Field of Classification Search
CPC .................................. G06F 17/16; G11C 8/04
USPC ............................................................ 708/209
See application file for complete search history.

(56) References Cited

U.S. PATENT DOCUMENTS 6,721,770 B1 *  4/2004  Morton .................. G06F 17/11
                                                                    702/104

* cited by examiner

*Primary Examiner* — Tan V. Mai
(74) *Attorney, Agent, or Firm* — Chih Feng Yeh; Huntington IP Consulting Co., Ltd.

(57) ABSTRACT

A measurement matrix generating system based on scrambling and a method thereof are disclosed. A plurality of independent identically distributed (i.i.d) elements is pre-stored in a circulant matrix register array, selections are made among the elements so as to perform an algebraic operation on the selected elements, and a measurement matrix with high availability is generated according to results of the operations, so as to achieve the technical effect of improving the availability of the measurement matrix in compressive sensing.

10 Claims, 8 Drawing Sheets

Circulant output of a three-bit LFSR: [1, 4, 6, 7, 3, 5, 2]

$i^{(1)} = 0$ $i^{(2)} = (i^{(1)} + 1) \bmod 15 = 1$ $i^{(3)} = (i^{(2)} + 4) \bmod 15 = 5$ $i^{(4)} = (i^{(3)} + 6) \bmod 15 = 11$ $i^{(5)} = (i^{(4)} + 7) \bmod 15 = 3$ $\vdots$

MEASUREMENT MATRIX GENERATING SYSTEM BASED ON SCRAMBLING AND METHOD THEREOF

CROSS-REFERENCE TO RELATED APPLICATION

This application claims the benefit of U.S. Provisional Application No. 62/308,231, filed Mar. 15, 2016, which are herein incorporated by reference.

BACKGROUND

Technical Field

The present invention relates to a matrix generating system and a method thereof, and in particular to a measurement matrix generating system based on scrambling and a method thereof for generating a measurement matrix with high availability.

Related Art

In recent years, with the popularization and development of compressive sensing, compressive sensing becomes widely applied in many fields, for example, in Internet backbone and biomedical signal monitoring systems.

In general, compressive sensing is to obtain a low dimensional measurement value from a high dimensional sparse signal by using a measurement matrix. Therefore, a system only needs to use a low dimensional signal for transmission, and reconstruct, when needed, a low dimensional sampling as a high dimensional signal by using methods such as norm minimization. The compressive sensing has two characteristics: (1) sampling at a frequency lower than Nyquist Theorem so as to reduce a cost and power consumption of a digital-to-analog converter in a sensor; and (2) achieving compression effects while sampling without additional compression hardware, so as to save a cost and power consumption for hardware compression of a traditional sensor.

Traditionally, a compressive sensing measurement matrix often uses a random matrix. However, in order to simplify the technology, improve efficiency, and reduce a storage cost, replacing the random matrix with a structured matrix is also suggested, thereby decreasing the number of elements to be memorized. For example, in the random matrix, there are M×N elements to be memorized. However, in the structured matrix, for example, a circulant matrix as an example, there are only N elements to be memorized; and using a Toeplitz matrix as an example, there are only (M+N−1) elements to be memorized. In this way, as the number of elements to be memorized decreases, a cost for hardware implementation is also significantly reduced. However, the compressive sensing is based on sparse characteristics of signals, and the signals need to be sparse enough to be restored. If the foregoing structured matrix is used as the measurement matrix, it is possible that original signals cannot be restored. Therefore, availability of the measurement matrix is not good.

In view of the above, the problem that availability of the measurement matrix is not good exists in the prior art for a long time. Therefore, it is necessary to provide an improved technical means to solve this problem.

SUMMARY

The present invention discloses a measurement matrix generating system based on scrambling and a method thereof.

First, the present invention discloses a measurement matrix generating system based on scrambling. The system includes: an initial module, a selection module, and a scrambling module. The initial module is configured to pre-store a plurality of independent identically distributed (i.i.d) elements in a circulant matrix register array. The selection module is configured to select at least one from the elements. The scrambling module is configured to perform an algebraic operation on the selected elements so as to generate a measurement matrix.

In addition, the present invention discloses a measurement matrix generating method based on scrambling, including the following steps: pre-storing a plurality of i.i.d elements in a circulant matrix register array; selecting at least one from the elements; and performing an algebraic operation on the selected elements to generate a measurement matrix.

The system and method disclosed in the present invention are as stated above. The present invention differs from the prior art in pre-storing i.i.d elements in a circulant matrix register array, selecting from the elements so as to perform an algebraic operation on the selected elements, and further generating a measurement matrix with high availability according to results of the operations.

According to the foregoing technical means, the present invention may achieve the technical effect of improving the availability of the measurement matrix in compressive sensing.

DETAILED DESCRIPTION

Implementation manners of the present invention are described in detail below with reference to the drawings and embodiments. On this basis, the implementation process of the present invention of how to solve technical problems by applying the technical means and achieve technical effects can be fully understood and implemented.

The present invention is briefly described before describing the measurement matrix generating system based on scrambling and a method thereof that are disclosed in the present invention. The present invention is applied to compressive sensing technologies, and in particular to generating a measurement matrix Φ applied to compressive sensing. Meanwhile, the present invention is efficient and is low in cost. A measurement matrix with high availability is generated by pre-storing a small amount of random values and then post-processing these values by using a scrambling method.

Figure 1:
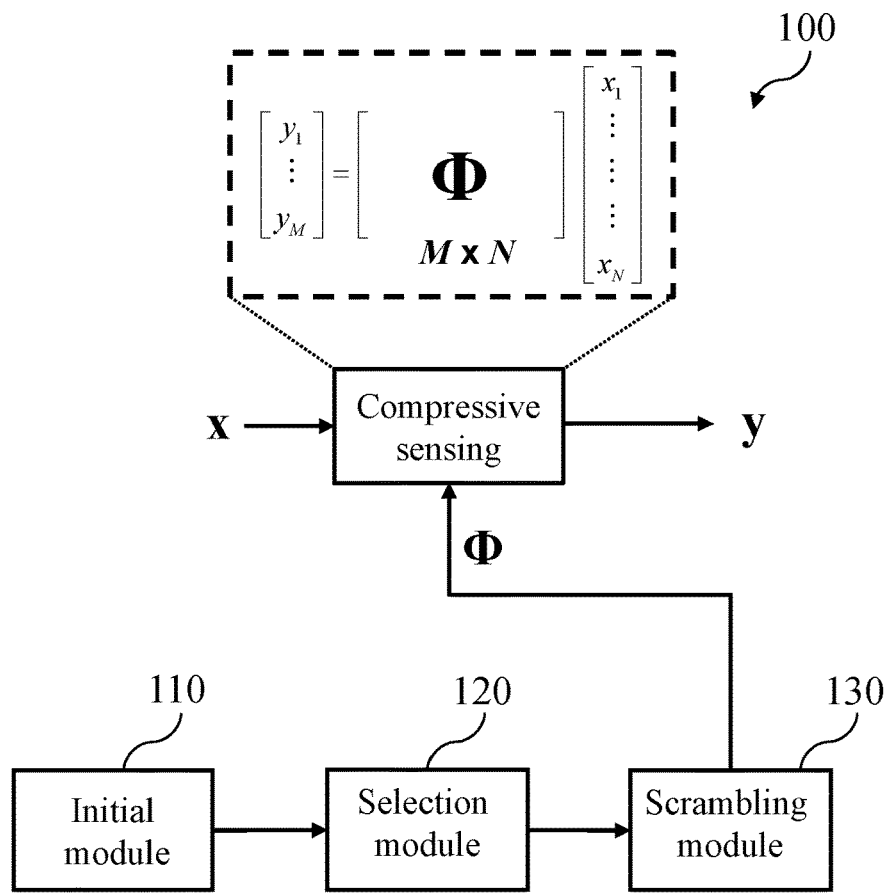
FIG. 1 is a system block diagram of a measurement matrix generating system based on scrambling according to the present invention.

The measurement matrix generating system based on scrambling and a method thereof according to the present invention are further described below with reference to the drawings. First refer to FIG. 1. FIG. 1 is a system block diagram of a measurement matrix generating system based on scrambling according to the present invention. The system includes: an initial module 110, a selection module 120, and a scrambling module 130. In actual implementations, the three modules are disposed at a compressive sensing front end 100 to generate a measurement matrix for the compressive sensing to sample and compress.

The initial module 110 is configured to pre-storing a plurality of independent identically distributed (i.i.d) elements in a circulant matrix register array. Specifically, a structure of the circulant matrix is as follows:

$$\begin{bmatrix} a_N & a_{N-1} & a_{N-2} & \ldots & a_2 & a_1 \\ a_1 & a_N & a_{N-1} & \ldots & a_3 & a_2 \\ a_2 & a_1 & a_N & \ldots & a_4 & a_3 \\ \vdots & \vdots & \ddots & \ddots & \vdots & \vdots \\ a_{M-1} & a_{M-2} & a_{M-3} & \ldots & a_{M-1} & a_M \end{bmatrix}$$

A random matrix is considered to be an optimized measurement matrix, for example: a random Bernoulli matrix. However, compared with the random matrix, a structured matrix, e.g. a circulant matrix, decreases the number of storage components (for example: a register, or a memory). Therefore, the hardware cost can be significantly reduced and the hardware implementation can be significantly increased. Therefore, traditionally, a circulant matrix is often used as a measurement matrix. In addition, elements pre-stored by the initial module 110 may also form a structured or an unstructured matrix.

The selection module 120 is configured to select at least one from the elements. In actual implementations, the selection module may continuously select among the elements in a mode of equal-spaced hop-selection (ES-HS) or random-spaced hop-selection (RS-HS), wherein a space of the ES-HS is a preset positive integer, for example: 4, 5, or 6; and a space of the RS-HS may be generated by a linear feedback shift register (LFSR). The LFSR is a shift register for, when an output of a prior status is given, using a linear function of the output as an input again. In actual implementations, the LFSR includes: a Fibonacci LFSR, a Galois LFSR, and a Fibonacci-Galois hybrid LFSR. The two selection modes are described in detail below with reference to the drawings. In addition, in actual implementations, each selected element may be operated by using different functions.

The scrambling module 130 is configured to perform an algebraic operation on the selected elements to generate a measurement matrix Φ. The performing algebraic operations may be multiplying each selected element by a preset value, the value being 1 or −1. In addition, the performing algebraic operations may also be multiplying by a preset value, and then performing four arithmetic operations with another value, for example: first multiplying by −1 and then adding by 0.1; first multiplying by 1 and then adding by 0.1; first multiplying by −1 and then subtracting by 0.1; first multiplying by 1 and then subtracting by 0.1; first multiplying by −1 and then multiplying by 0.99; first multiplying by 1 and then multiplying by 0.99; first multiplying by −1 and then dividing by 0.99; and first multiplying by 1 and then dividing by 0.99. The present invention describes with reference to the foregoing examples, but does not make limitations on this basis. That is, any mode of generating a measurement matrix by performing an algebraic operation on the selected elements should not depart from an application scope of the present invention. In actual implementations, as shown in FIG. 1, the measurement matrix Φ generated by the scrambling module 130 is an M×N matrix which provides compressive sensing for sampling and compressing input signals, wherein x is an N-dimensional input signal, and y is an M×1 vector.

Figure 2:
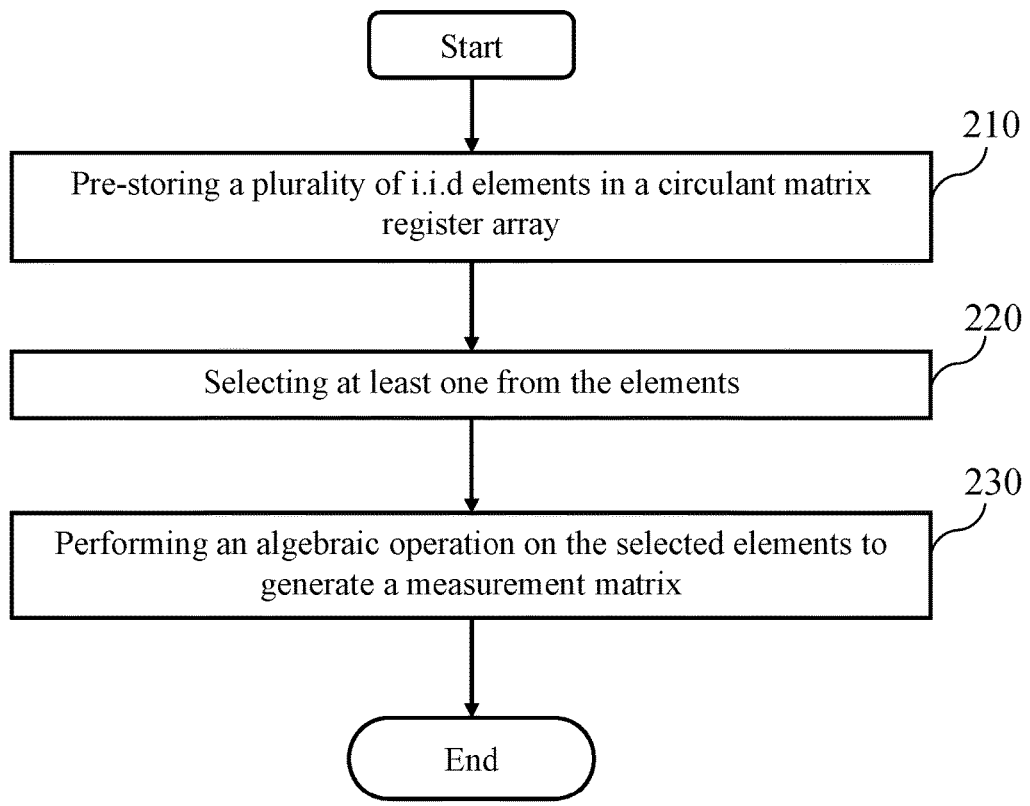
FIG. 2 is a method flowchart of a measurement matrix generating method based on scrambling according to the present invention.

Subsequently, refer to FIG. 2. FIG. 2 is a method flowchart of a measurement matrix generating method based on scrambling according to the present invention, including the following steps: pre-storing a plurality of i.i.d elements in a circulant matrix register array (step 210); selecting at least one from the elements (step 220); and performing an algebraic operation on the selected elements to generate a measurement matrix (step 230). According to the foregoing steps, a plurality of i.i.d elements may be pre-stored in a circulant matrix register array, selections may be made among these elements so as to perform an algebraic operation on the selected elements, and further a measurement matrix with high availability is generated according to results of the operations.

Figure 3:
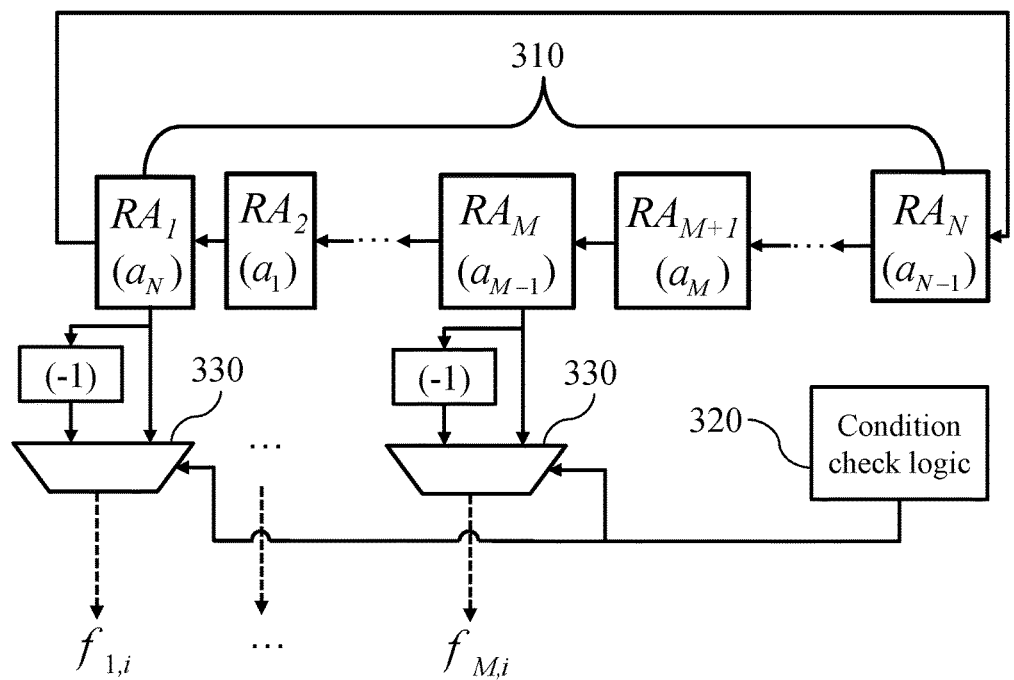
FIG. 3 is a schematic diagram of a circuit for generating a measurement matrix according to the present invention.

The following description is made with reference to FIG. 3 to FIG. 8 and in a mode of embodiments. First refer to FIG. 3. FIG. 3 is a schematic diagram of a circuit for generating a measurement matrix according to the present invention. A circulant matrix register array 310 includes a plurality of register arrays ($RA_1, RA_2, \ldots, RA_M, RA_{M+1}, \ldots,$ and $RA_N$) for storing elements of a circulant matrix. In actual implementations, the register arrays may be replaced with memories, for example a read-only memory (ROM). The register arrays are coupled to arithmetical logic to execute a scrambling method. Using FIG. 3 as an example, a value of an element is multiplied by value −1 to complete modification. According to another aspect, a condition check logic 320 is used to control a multiplexer 330 so as to determine whether to select a modified element. In actual implementations, a preset modification matrix M may be corresponded to the condition check logic 320 to realize the control, where the modification matrix M is as shown below:

$$\begin{bmatrix} -1 & 0 & 0 & 0 & 0 \\ 0 & 1 & 0 & 0 & 0 \\ 0 & 0 & 1 & 0 & 0 \\ 0 & 0 & 0 & -1 & 0 \\ 0 & 0 & 0 & 0 & 1 \end{bmatrix}$$

Figure 4:
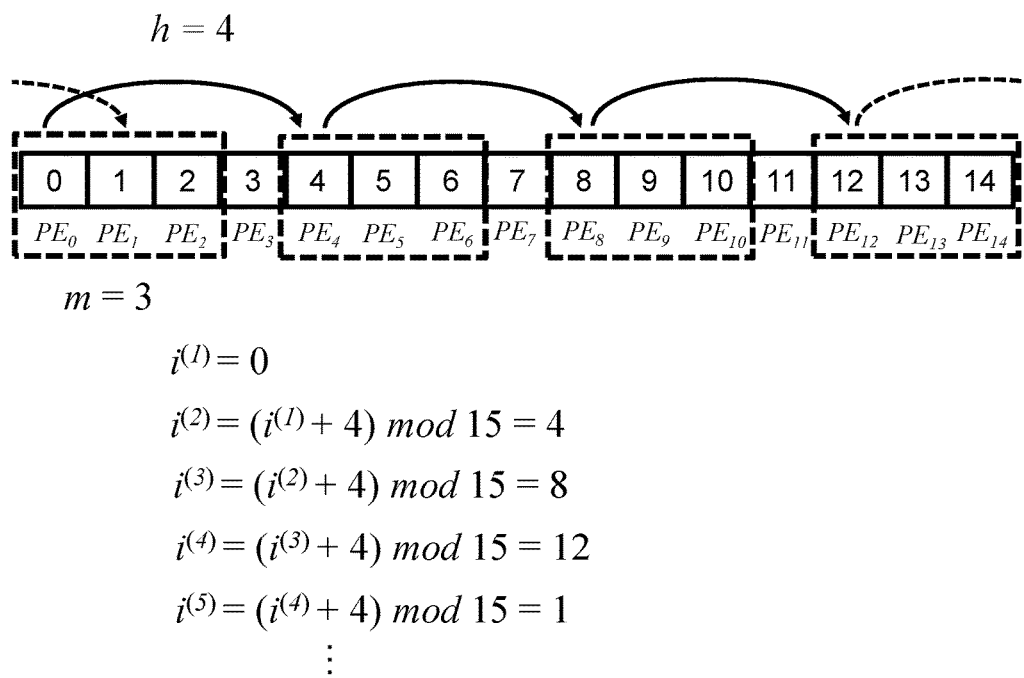
FIG. 4 is a schematic diagram of selecting an element in a mode of equal-spaced hop-selection according to the present invention.

Refer to FIG. 4. FIG. 4 is a schematic diagram of selecting an element in a mode of equal-spaced hop-selection according to the present invention. As mentioned above, the selection module 120 is configured to select at least one from the elements. In actual implementations, supposing L is the number of pre-stored elements, m represents the number of elements output at the same time, $PE_j$ represents the jth element, an index i is used to determine a first element of a selection, this selection outputs $PE_i$ to $PE_{i+m-1}$ at the same time, and h represents the number of spaces of ES-HS, then a formula of generating the index is as shown below:

$$i^{(t+1)} = (i^{(t)} + h) \bmod L$$

$i^{(t)}$ is an index of the tth selection, and $i^{(1)}$ is set as 0. Using FIG. 4 as an example, because h=4, m=3, and L=15, an index of the first selection is 0, and $PE_0$ to $PE_2$ are output at the same time; an index of a second selection is 4, and $PE_4$ to $PE_6$ are output at the same time; an index of a third selection is 8, and $PE_8$ to $PE_{10}$ are output at the same time; an index of a fourth selection is 12, and $PE_{12}$ to $PE_{14}$ are output at the same time; an index of a fifth selection is 1, and $PE_1$ to $PE_3$ are output at the same time; and the like.

Figure 5:
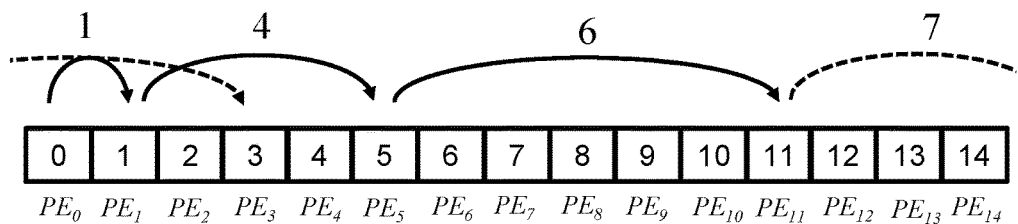
FIG. 5 is a schematic diagram of selecting an element in a mode of random-spaced hop-selection according to the present invention.

As shown in FIG. 5, FIG. 5 is a schematic diagram of selecting an element in a mode of RS-HS according to the present invention. In the mode of RS-HS, a formula of generating an index is as shown below:

$$i^{(t+1)}=(i^{(t)}+\lambda) \bmod L$$

The parameter $\lambda$ is generated by the LFSR, and other parameters are same as those described in FIG. 4. Supposing a circulant output of a three-bit LFSR is "1, 4, 6, 7, 3, 5, 2", and L=15, then the index of the first selection is 0, the index of the second selection is 1; the index of the third selection is 5; the index of the fourth selection is 11; the index of the fifth selection is 3; and the like. A corresponding element may be selected by using the index.

Figure 6:
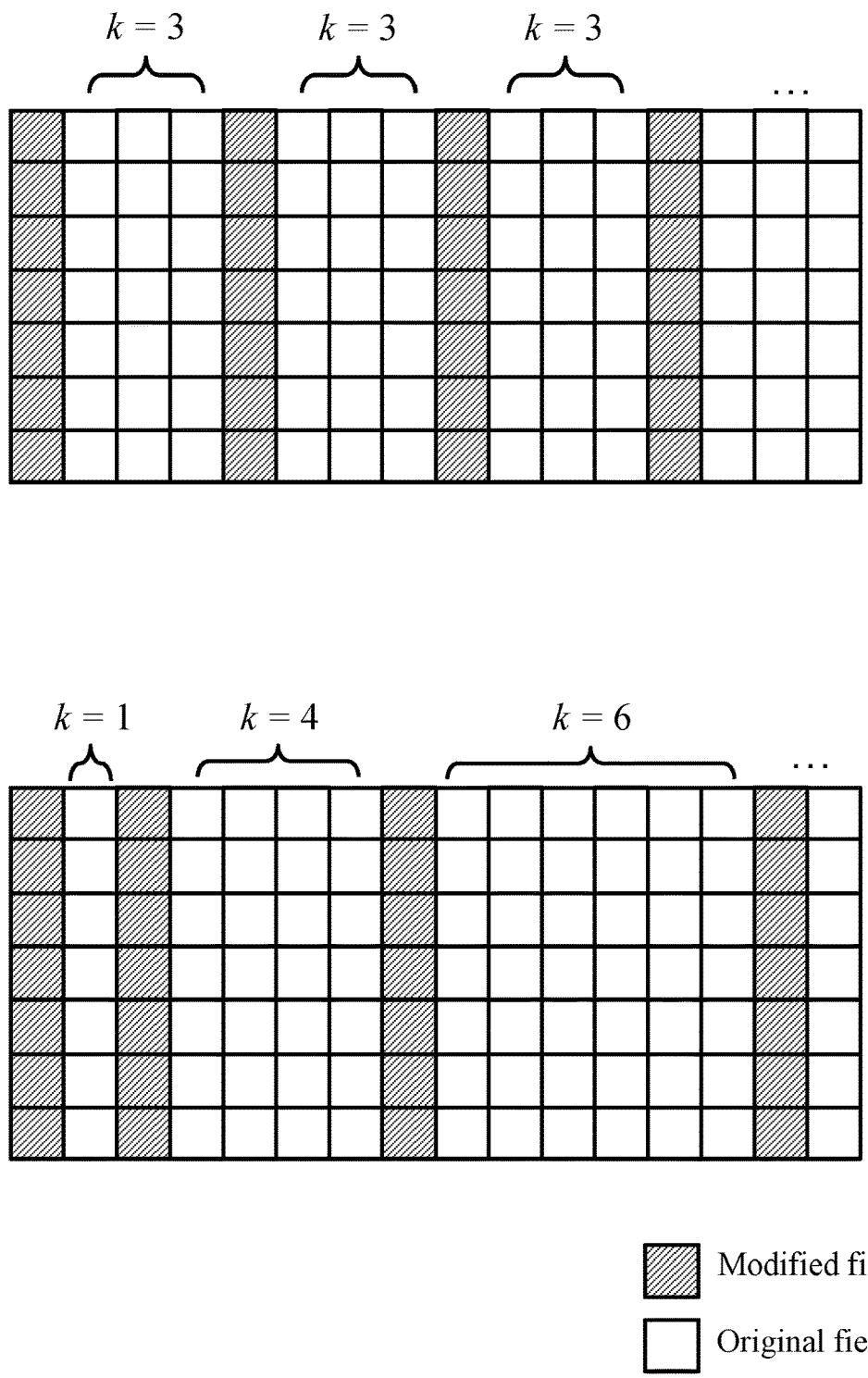
FIG. 6 is a schematic diagram of a modified field in a measurement matrix according to the present invention.

Refer to FIG. 6. FIG. 6 is a schematic diagram of a modified field in a measurement matrix according to the present invention. According to examples of selecting an element in FIG. 4 and FIG. 5, after an element is selected in a mode of ES-HS as shown in FIG. 4 and a modification is performed (for example, multiplying by 1 or −1), as shown in FIG. 6 above, a space k between modified fields in a matrix is fixed as value 3. Fields after an element is selected in a mode of RS-HS and a modification is performed are as shown in FIG. 6 below, wherein a space k between modified fields in the matrix is a random space generated by the three-bit LFSR, for example: 1, 4, 6, . . . . In actual implementations, a cost for implementing the mode of RS-HS is higher than that for implementing the mode of ES-HS, but this still can be ignored.

Figure 7:
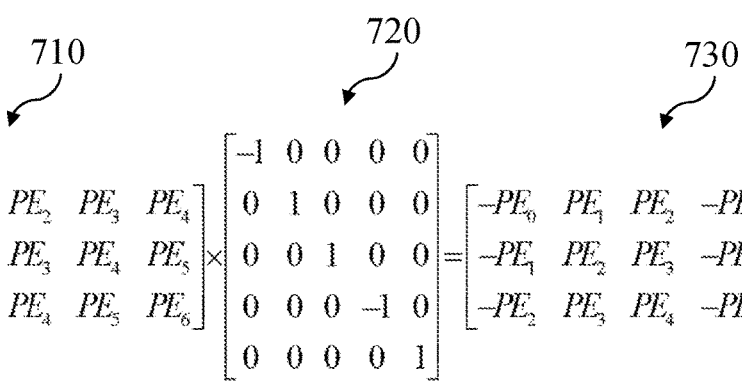
FIG. 7 is a schematic diagram of increasing randomness of a measurement matrix according to the present invention.

Refer to FIG. 7. FIG. 7 is a schematic diagram of increasing randomness of a measurement matrix according to the present invention. From left to right, there are a circulant matrix 710, a modification matrix 720, and a measurement matrix 730. When executing the scrambling method, it may be considered to be multiplying the circulant matrix 710 and the modification matrix 720 so as to generate the measurement matrix 730. It can be clearly seen from the figure that the randomness of the measurement matrix 730 can be increased by applying the scrambling method of the present invention. It should be particularly noted that the modification matrix 720 is not pre-stored in a register or a memory, but is an equivalent matrix formed when the selection module 120 and the scrambling module 130 perform element selection and algebraic operation. Therefore, to facilitate description, description is made by using the modification matrix 720 shown in FIG. 7 as an example. In actual implementations, a size of the modification matrix and a value of an element change with a size of the circulant matrix, a mode for the selection module 120 to select an element, and the algebraic operation of the scrambling module 130. Increasing the randomness of the measurement matrix according to the scrambling method is efficient and is low in cost, so as to enable a generated measurement matrix to have high availability.

Figure 8:
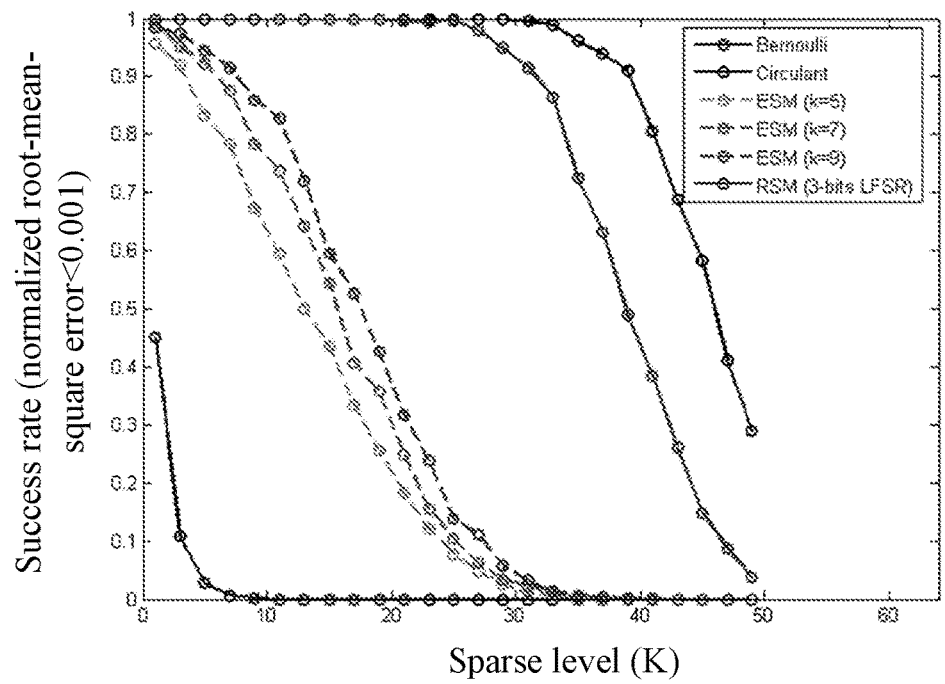
FIG. 8 is a schematic diagram of comparing reconstruction performances of a measurement matrix according to the present invention and a traditional measurement matrix.

As shown in FIG. 8. FIG. 8 is a schematic diagram of comparing reconstruction performances of a measurement matrix according to the present invention and a traditional measurement matrix A size of the measurement matrix is 128×512; an input signal x is a randomly generated K sparse vector with a size of 512×1; a base matrix is configured to be an inverse discrete cosine transform matrix of a size 512×512, and a reconstruction algorithm is simulated by using an OMP algorithm. To evaluate the reconstruction performance, calculation is performed by using normalized root-mean-square error (NRMSE). It can be clearly seen from FIG. 8 that by combining RS-HS and the measurement matrix generated by the three-bit LFSR (i.e. an RSM (3 bits LFSR)), a success rate for reconstruction thereof is close to that of a random Bernoulli matrix (i.e., Bernoulli) which has the highest success rate. However, in hardware implementations, number of logic gates used by a hardware architecture applying the present invention is about 3.02K, being far less than the number of logic gates used by the random Bernoulli matrix (about 26.6K). Therefore, the hardware architecture applying the present invention has less power consumption and lower hardware cost.

In view of the above, the present invention differs from the prior art in pre-storing i.i.d elements in a circulant matrix register array; selecting from the elements so as to perform an algebraic operation on the selected elements, and further generating a measurement matrix with high availability according to results of the operations. According to this technical means, problems exist in the prior art may be solved, so as to achieve the technical effect of improving the availability of the measurement matrix in compressive sensing.

What is claimed is:

1. A measurement matrix generating system based on scrambling, comprising:
    an initial module, including a circulant matrix register array, configured to store a plurality of independent identically distributed (i.i.d.) elements of a circulant matrix;
    a scrambling module, configured to perform an algebraic operation on each of the plurality of i.i.d. elements to generate a modified element corresponding thereto; and
    a selection module, including a plurality of multiplexers and a condition check logic, wherein the condition check logic is used to control each of the plurality of multiplexers to determine to select the i.i.d. element or the modified element corresponding thereto, which are inputted to the same multiplexer, to generate a measurement matrix.

2. The measurement matrix generating system based on scrambling according to claim 1, wherein the plurality of i.i.d. elements stored by the initial module form a structured or an unstructured matrix.

3. The measurement matrix generating system based on scrambling according to claim 1, wherein each of the plurality of i.i.d. elements is operated by using different functions.

4. The measurement matrix generating system based on scrambling according to claim 1, wherein the selection module determines to select the i.i.d. element or the modified element corresponding thereto, which are inputted to the same multiplexer, in a mode of equal-spaced hop-selection (ES-HS) or random-spaced hop-selection (RS-HS), a space of the ES-HS is a preset positive integer, and a space of the RS-HS is generated by a linear feedback shift register (LFSR).

5. The measurement matrix generating system based on scrambling according to claim 1, wherein the algebraic operation performed by the scrambling module is multiplying each selected element by a preset value, the value being 1 or −1.

6. A measurement matrix generating method based on scrambling, comprising the following steps:

storing a plurality of independent identically distributed (i.i.d.) elements of a circulant matrix by a circulant matrix register array;

performing an algebraic operation, by a scrambling module, on each of the plurality of i.i.d. elements to generate a modified element corresponding thereto; and controlling each of a plurality of multiplexers, by a condition check logic, to determine to select the i.i.d. element or the modified element corresponding thereto, which are inputted to the same multiplexer, to generate a measurement matrix.

7. The measurement matrix generating method based on scrambling according to claim 6, wherein the plurality of i.i.d. elements stored by the initial module form a structured or an unstructured matrix.

8. The measurement matrix generating method based on scrambling according to claim 6, wherein each of the plurality of i.i.d. elements is operated by using different functions.

9. The measurement matrix generating method based on scrambling according to claim 6, wherein the selection module determines to select the i.i.d. element or the modified element corresponding thereto, which are inputted to the same multiplexer, in a mode of equal-spaced hop-selection (ES-HS) or random-spaced hop-selection (RS-HS), a space of the ES-HS is a preset positive integer, and a space of the RS-HS is generated by a linear feedback shift register (LFSR).

10. The measurement matrix generating method based on scrambling according to claim 6, wherein the algebraic operation is multiplying each selected element by a preset value, the value being 1 or −1.

* * * * *